United States Patent [19]
Yoo

[11] Patent Number: 5,970,002
[45] Date of Patent: Oct. 19, 1999

[54] SEMICONDUCTOR MEMORY DEVICE HAVING REDUNDANCY FUNCTION

[75] Inventor: Jei-Hwan Yoo, Suwon, Rep. of Korea

[73] Assignee: Samsung Electronics Co., Ltd., Kyungki-do, Rep. of Korea

[21] Appl. No.: 09/056,931

[22] Filed: Apr. 8, 1998

Related U.S. Application Data

[63] Continuation-in-part of application No. 08/639,089, Apr. 24, 1996, abandoned.

[51] Int. Cl.$^6$ ...................................................... G11C 7/00
[52] U.S. Cl. ................. 365/200; 365/225.7; 365/230.03; 365/230.06
[58] Field of Search ............................... 365/200, 230.06, 365/230.03, 225.7

[56] References Cited

U.S. PATENT DOCUMENTS

| | | | |
|---|---|---|---|
| 4,914,632 | 4/1990 | Fujishima et al. | 365/200 |
| 5,343,429 | 8/1994 | Nakayama et al. | 365/200 |
| 5,373,471 | 12/1994 | Saeki et al. | 365/200 |
| 5,652,725 | 7/1997 | Suma et al. | 365/200 |

*Primary Examiner*—Son T. Dinh
*Attorney, Agent, or Firm*—Pillsbury Madison & Sutro LLP

[57] ABSTRACT

A high-density semiconductor memory device may be provided with redundant memory, so that it is capable of repairing defects generated in a normal memory cell array by using a spare memory cell array which has a plurality of sub memory cell arrays, split word line driver blocks and sense amps. The spare memory cell array includes a plurality of unit spare mats, each having a given number of the sub memory cell arrays, split word line driver blocks, spare sense amps, and a corresponding spare column decoder. The spare memory cell array further includes a plurality of spare row decoders. A control unit is provided for controlling the split word line driver blocks included in each of the unit spare mats in response to given address signals.

7 Claims, 6 Drawing Sheets

SEMICONDUCTOR MEMORY DEVICE HAVING REDUNDANCY FUNCTION

This is a Continuation-in-Part of: National Appln. Ser. No. 08/639,089 filed Apr. 24, 1996.

BACKGROUND OF THE INVENTION

1. Field of the Invention

The present invention relates to a semiconductor memory device, and more particularly to a redundancy thereof.

2. Description of Background Information

The cost of a semiconductor integrated circuit depends upon the yield in manufacturing. In order to improve manufacturing yield, redundancy memory cells (or spare memory cells) may be provided apart from a fundamental memory cell (or normal memory cell). If a few defective bits (or defective cells) are found in the fundamental memory cell, a redundancy method may be employed to replace the defective cells with the spare memory cells. However, in a high density integrated memory device having a large capacity of more than 256Mb, a stand-by current defect (DC current leakage) and block failures are frequently generated. Stand-by current defects (DC current leakage) are frequently caused during a manufacturing process due to an increase in chip size, and block failures are frequently generated due to a lack of plate margin for manufacturing (e.g., the width of the line becomes narrower).

A stand-by current defect (DC current leakage) causes a stand-by power dissipation due to current leakage from a defective row. A block failure results when there are a plurality of defective word lines or bits lines, which may be generated, for example, due to a short of a word line or a bit line with another word line or bit line adjacent thereto. Accordingly, since a block failure results from more than one defective word line or bit line, it cannot be repaired unless there is a spare row or spare column which can be substituted for the defective word line or bit line. Accordingly, high density integrated semiconductor memory devices present unique defects and failures which require improved strategies to effectively repair defective memory cells of a die.

A recent technique proposed for solving the redundancy problems associated with large capacity, high density semiconductor memory devices is disclosed by M. Asakura et al. and Mitsubishi Electric Corporation in a paper entitled "A 34ns 256Mb DRAM with Boosted Sense-Ground Scheme", ISSCC, pp. 140–141 (1994), the content of which is hereby incorporated herein by reference in its entirety. FIG. 1 illustrates the redundancy method disclosed in this paper. FIG. 1 includes a sub memory cell array 30 which comprises a normal sub memory cell array 320 and a spare sub memory cell array 340. Normal sub memory cell array 320 comprises a plurality of sub blocks, ranging from SUB BLOCK 1 to SUB BLOCK 32; and spare sub memory cell array 340 comprises a plurality of spare sub blocks, ranging from SPARE SUB BLOCK 1 through SPARE SUB BLOCK 32.

A normal row decoder NRD and a spare row decoder SRD are respectively connected to normal sub memory cell array 320 and spare sub memory cell array 340 for decoding rows within the respective arrays. A column decoder CD is shown in FIG. 1 to the right of sub memory cell array 30, and is provided for decoding the columns within either of normal sub memory cell array 320 and spare sub memory cell array 340.

A fuse box 10 is provided and has an output connected to each of a plurality of decoding elements provided within spare row decoder SRD for respective spare sub blocks. Normal row decoder NRD and spare row decoder SRD comprise a common input which receives a voltage signal VWLH, for providing a boosting voltage to a word line of the memory cell. That voltage is coupled to each of the plural row decoding elements through either a fuse 1 or a transistor switch 2.

If a stand-by current defect (i.e., a DC current leakage) is generated in the last sub block (SUB BLOCK 32) included in normal sub memory cell array 320, its corresponding row decoder fuse 1 is blown out, so that the voltage signal VWLH is not provided to the word line corresponding to that sub block. Consequently, the path of the leakage current is severed. In addition, the leakage path of the stand-by current may be formed by a bridge defect between a cell plate and a bit line. When such a bridge defect exists, while a connection is established between plate voltage VCP to each sub block of normal sub memory cell array 320 through a column decoder fuse 3 (or to a spare sub block through the use of a column decoder transistor switch 4), the path of the stand-by leakage current may be severed by turning on a column detector transistor switch 4 connected to the corresponding spare sub block, instead of blowing a column detector fuse 3 of the corresponding normal sub block.

FIG. 1A illustrates a detailed block diagram of the prior art layout. Row decoders "r1" are assigned so as to correspond to each sub block (for example, a set of sixteen 256 Kb unit array has a memory capacity of 4Mb) "sub1," one by one. Column decoders "c1" are assigned so as to correspond to each unit array, each having capacity of 256Kh, one by one. The above unit array is arranged along same column within a plurality of the sub blocks. Thus, the spare memory cell array, SMCA, independently uses the row decoder "sr1" for redundancy, autonomous from the above row decoder "r1" which is assigned to the normal memory cell array NMCA, and uses the column decoder "c1" in common with the normal memory cell array NMCA. In a memory device having a memory capacity of 256Mb, the sub block connected to a row decoder has a memory capacity of 2Mb; whereas, in a memory device having a memory capacity of 1Gb, the sub block connected to a row decoder has a memory capacity of 4Mb as shown in FIG. 1A. For example, therefore, in case that defective cells are detected in five sub blocks "sub 1", in order to carry out a repair operation block by block, space sub memory cell arrays of 10Mb and 20Mb are respectively required in the semiconductor memory devices of 256Mb and 1Gb. Since the spare sub memory cell arrays of 20Mb is required in the memory system as shown in FIG. 1A, five spare sub blocks "rsub 1" are employed to carry out the repair operation. As a result, in the high density integrated semiconductor memory device having a large capacity, the redundancy efficiency becomes significantly low so as to inevitably cause an increase in the chip size.

The illustrated conventional redundancy method, as described above, presents several disadvantages. In order to replace a normal sub block unit in memory cell array 30, a spare sub block must be available which is connected to the same common row decoder. In a semiconductor memory device having a large capacity of more than 256Mb, the sub memory cell array 320 connected to one row decoder will generally have a memory capacity of about 2Mb. In a semiconductor memory device of 1Gb, the sub memory cell array has a memory capacity of 4Mb. Therefore, for example, if five sub memory cell arrays have a stand-by current defect (i.e., a current leakage), in order to repair such a defect, spare sub memory cell arrays of 10Mb and 20Mb are respectively required in each of the above semiconductor devices (of 256Mb and 1Gb). Therefore, the size of the chip will be significantly increased. Another disadvantage occurs when a leakage current is generated in one normal sub block, since the entire sub memory cell array 30 must be replaced by a spare sub memory cell array. Accordingly, redundancy efficiency is significantly low.

A further disadvantage is that the spare sub block shares a column decoder CD with its corresponding normal sub block, and redundancy information based upon the fuse program is not applied to column detector CD. Accordingly, if a defect is generated in two or more normal sub blocks within a common column, it is impossible to replace the defective memory cell array 30 with spare sub blocks which are arranged only according to their row.

In addition, in the conventional redundancy method illustrated in FIG. 1, there is no ability to properly repair leakage current defects generated in parts of the memory circuitry not corresponding to a particular memory cell. Such defects may occur, for example, in: a core circuit area (e.g., an area where there is a sense amp), a row decoder, a column decoder, bit lines, and data input/output lines.

In addition, end differences in peripheral areas of the circuit are lower than such differences where the memory cells are arranged. Accordingly, dirt particles are easily deposited during the manufacturing process, increasing the occurrence of bridge defects.

SUMMARY OF THE INVENTION

Accordingly, an object of the present invention is to provide a semiconductor device with an enhanced redundancy efficiency and a large memory capacity, for example, of more than 256Mb.

Another object of the present invention is to provide a semiconductor memory device capable of repairing a memory cell array having an undesired current path (e.g., a DC current leakage) caused by a defect generated during the manufacturing process or due to a defect at a peripheral circuit area.

The present invention, therefore, is directed to a spare memory cell array for use in a semiconductor memory device to repair defects generated in a normal memory cell array. The spare memory cell array includes a plurality of sub memory cell arrays, split word line driver blocks, and sensing amplifiers (sense amps). More specifically, the spare memory cell array comprises a plurality of unit spare mats, each including a given number (e.g., 4) of spare memory cell arrays forming a sub memory cell array matrix (e.g., a 4×4 matrix) of columns and rows of the sub memory cell arrays. Each unit spare mat also comprises split word line driver blocks, sense amps, and a corresponding spare column decoder. A plurality of spare row decoders are provided, each corresponding to a column of the sub memory cell array matrix. Control means are provided for separately controlling, for each unit spare mat, the split word line driver blocks in response to given address signals.

BRIEF DESCRIPTION OF THE DRAWINGS

A more complete appreciation of the invention, and many of the attendant advantages thereof, will be more apparent by reference to the following detailed description considered together with the accompanying drawings, in which like reference symbols represent the same or similar components, and wherein.

DETAILED DESCRIPTION OF THE PREFERRED EMBODIMENT

Figure 1:
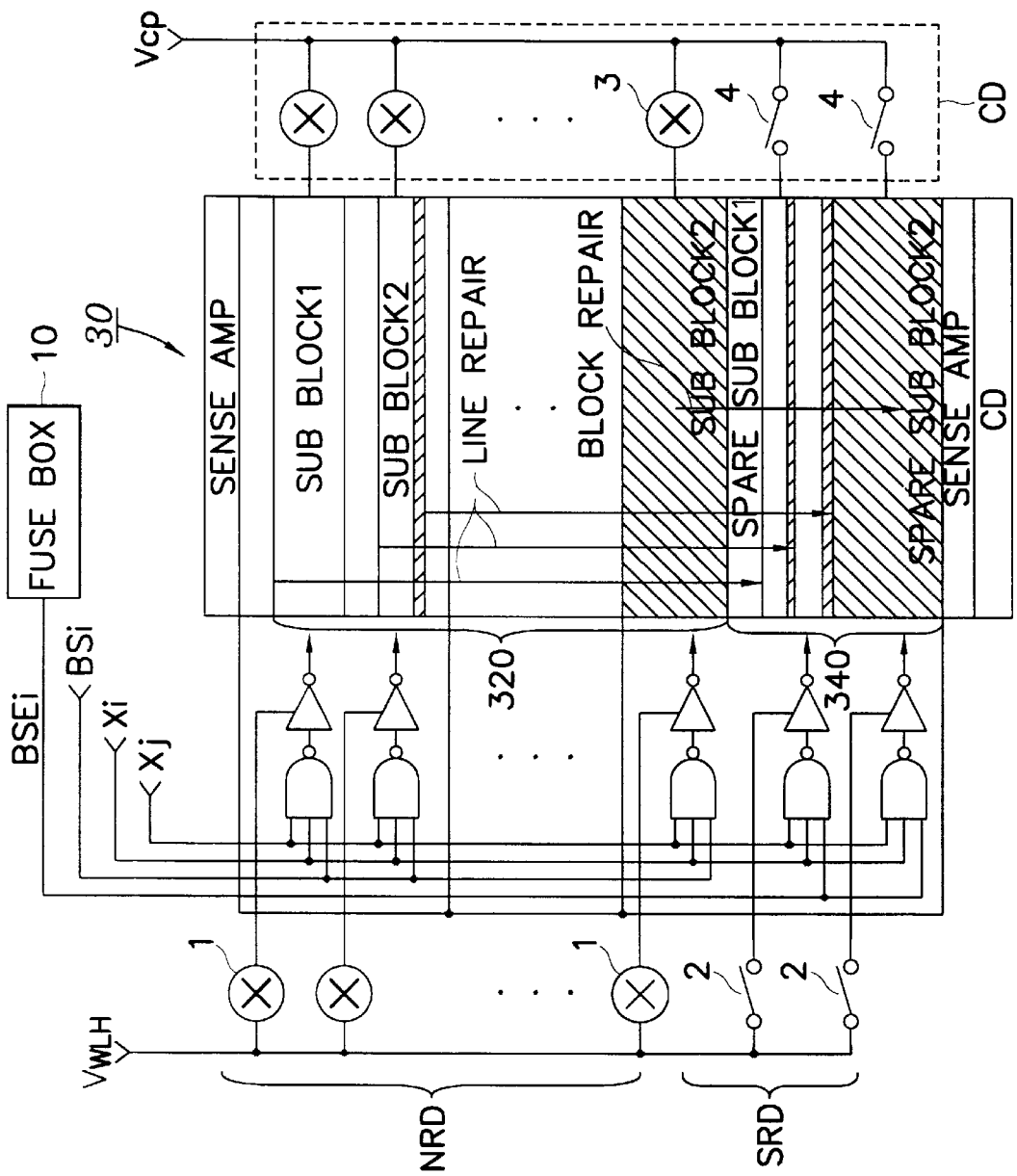
FIG. 1 is a circuit diagram representing a conventional memory system provided in a semiconductor memory device.
Figure 1A:
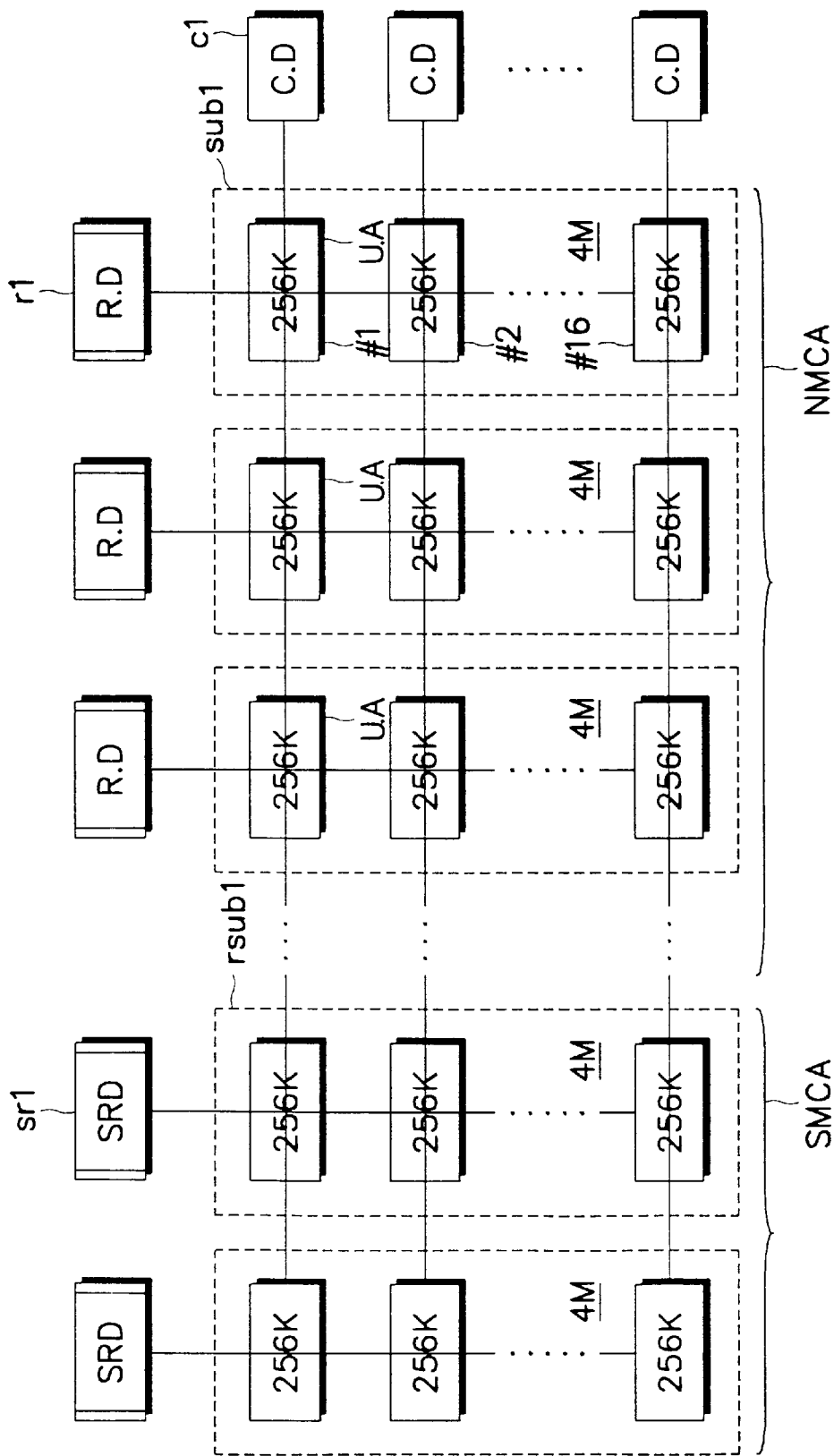
FIG. 1A is a schematic block diagram of a prior art spare memory cell array block.
Figure 2A:
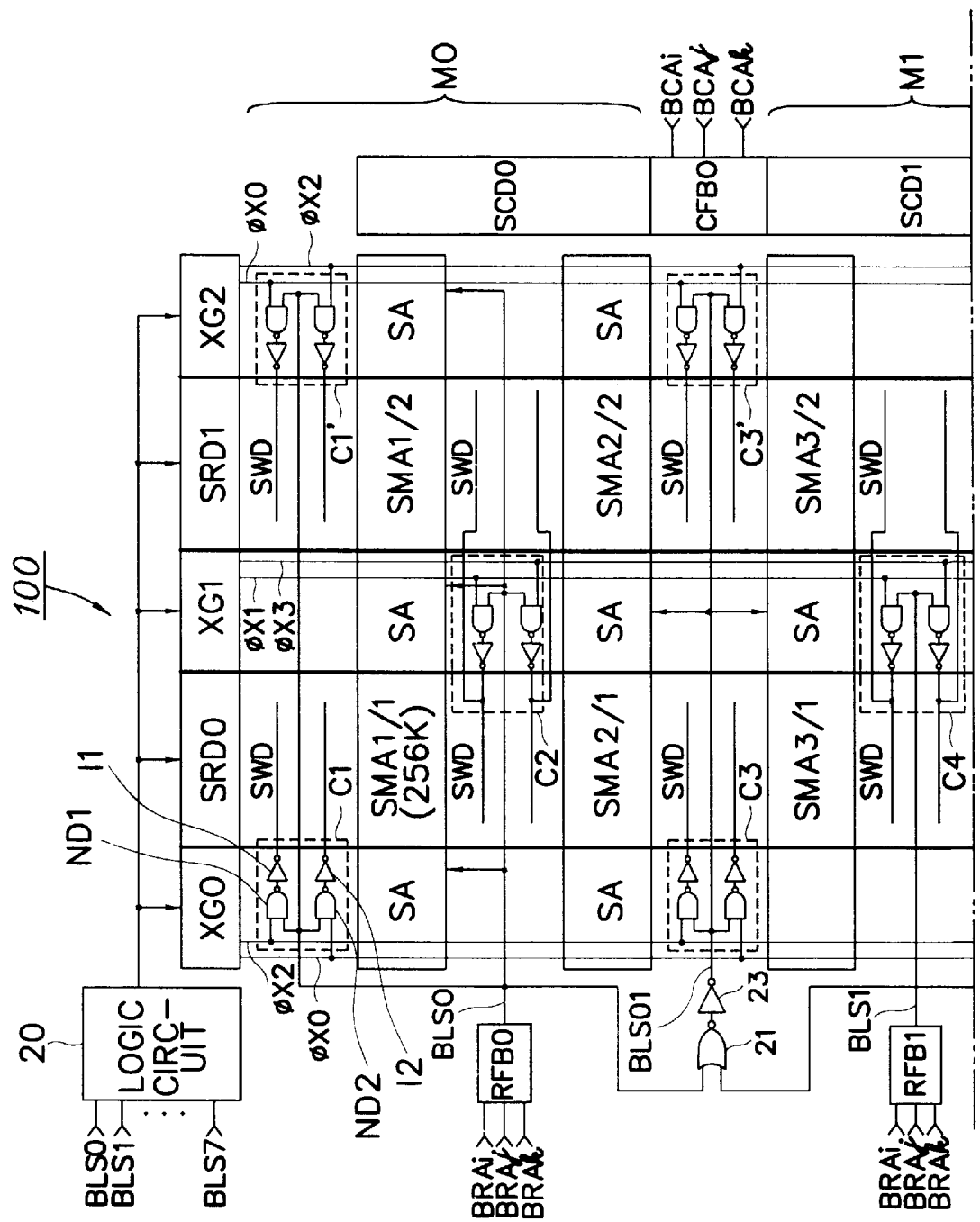
FIG. 2 is a circuit diagram of the redundant portions of a semiconductor memory device provided in accordance with the present invention.
Figure 2B:
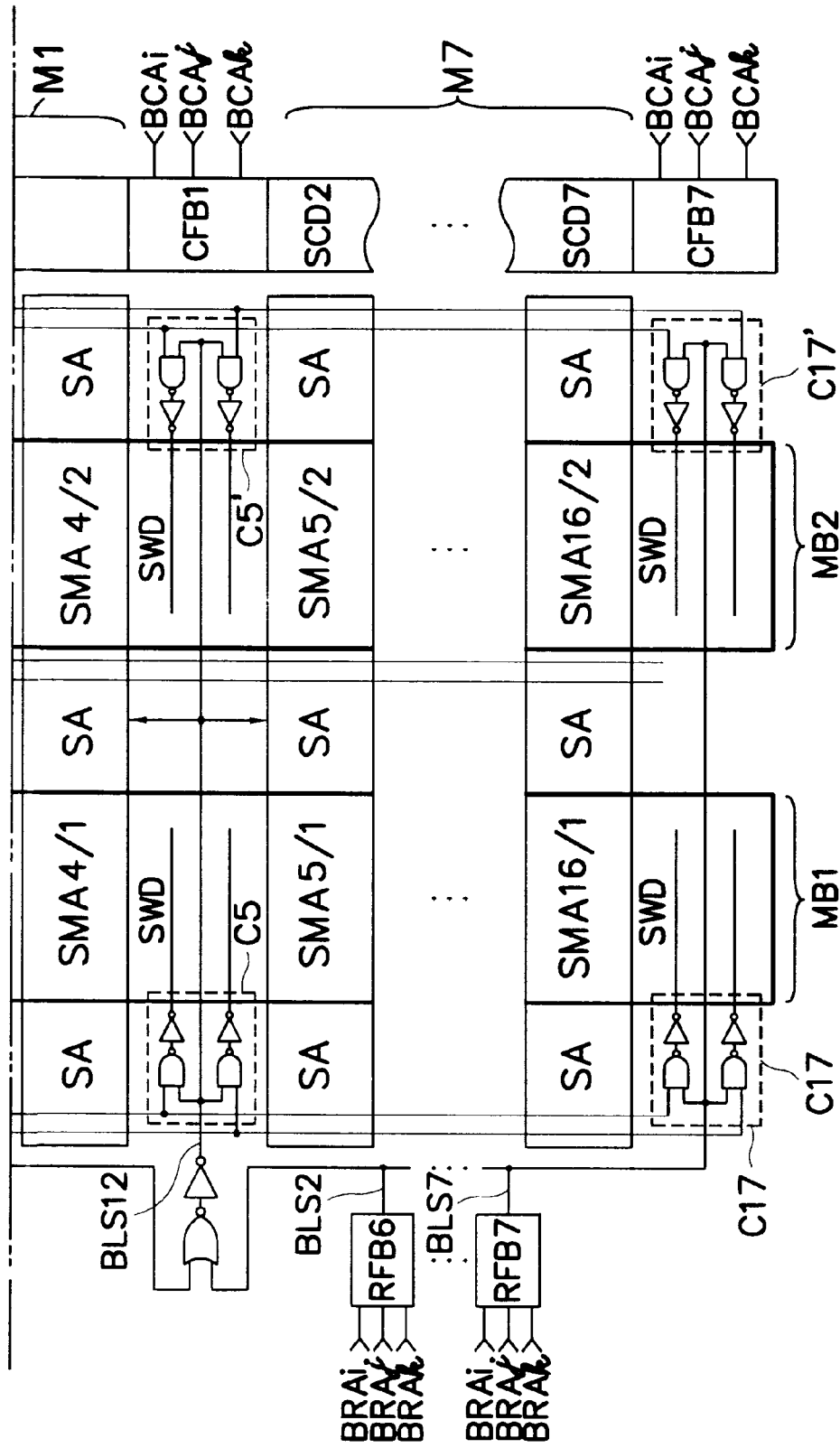

Referring now to the drawings in greater detail, FIG. 2 shows the structure of a spare memory cell array 100, which may be embodied in a dynamic random memory device DRAM having a memory capacity of 256Mb (or larger). The 256Mb DRAM (not shown) may comprise four memory banks, each having a memory capacity of 64Mb. Each memory bank may comprise sixteen memory blocks, each having a memory capacity of 4Mb. Each memory block may be categorized into sixteen sub memory cell arrays, each having a memory capacity of 256Kb.

One 64Mb memory bank of such a 256Mb DRAM (not shown) may comprise a row of sixteen 4Mb memory blocks. Each of the sixteen blocks may comprise a set of sixteen 256Kb sub memory cell arrays arranged along a column. In other words, a memory bank may comprise a 16×16 matrix of sub memory cell arrays. Each column of the 16×16 memory bank matrix is connected to a single corresponding row decoder, and each row within the 16×16 memory bank matrix is connected to a single corresponding column decoder.

In addition, split word driver blocks may be arranged between the 256Kb sub memory cell arrays of the memory bank. Each split word line driver block may be divided (split) into two word line drivers. The word lines included in one sub memory cell array may be divided into two groups and assigned to two different adjacent split word line driver blocks. A single word line is driven by a corresponding split word line driver provided within a split word line driver block. That single word line is enabled by a combination of a row decoder signal generated from a row decoder and a word line driving signal generated from a word line driving signal generating circuit.

The terms "sub memory cell array," "memory block," and "memory bank" are used for the sake of convenience in the present disclosure in order to distinguish among the different parts of an example 256Mb DRAM according to memory capacity.

The 256Mb DRAM (not shown) further comprises bit line sense amps arranged between the respective columns of the sub memory cell arrays which form the 16 columns of the memory bank. More specifically, one sense amp is provided between each side-by-side pair of sub memory cell arrays, and is shared by the two side-by-side sub memory cell arrays.

FIG. 2 illustrates the spare components that may be provided in a large capacity semiconductor memory device such as the 256Mb DRAM described above. In the circuitry of FIG. 2, spare sub memory cell arrays, spare split word line driver blocks, and spare sense amps are provided to form a spare memory cell array 100, and are arranged in the same manner as described above with respect to the normal memory portions of a 256Mb DRAM (not shown) as described above. However, the spare memory cell array 100 illustrated in FIG. 2 is divided into eight spare unit mats M0–M7.

Each unit spare mat in the illustrated embodiment has a capacity of 1Mb, and comprises four sub memory cell arrays SMA-, each sub memory cell array having a memory capacity of 256Kb. More specifically, each 1Mb unit spare mat may comprise a 2×2 matrix of sub memory cell arrays SMA-. Each of the eight unit spare mats M0–M7 is provided with a corresponding spare column decoder SCD0–SCD7. The eight unit spare mats M0–M7 share two spare row decoders SRD0 and SRD1. Spare column decoders SCD0–SCD7 and spare row decoders SRD0 and SRD1 are provided separate from and in addition to the row decoders and column decoders provided for the existing normal cell array.

The spare circuitry illustrated in FIG. 2 is further provided with a logic circuit 20, which performs an OR operation on input block selecting signals BLS0–BLS7. The spare memory circuity is further provided with a plurality (3 in the illustrated embodiment) of word line driving signal generating circuits XG0, XG1 and XG2. The output of logic circuit 20 forms an input which is common to each of spare row decoders SRD0 and SRD1 and each of word line driving signal generating circuits XG0, XG1 and XG2. Each of block selecting signals BLS0–BLS7 is generated from a respective one of several row fuse boxes RFB0–RFB7, each of which receives as inputs row address signals BRAi–BRAk corresponding to a block selection.

In addition, several column fuse boxes CFB0–CFB7 (8 in the illustrated embodiment) are provided, one for each 2×2 matrix of sub memory cell arrays. Each of these column fuse boxes CFB0–CFB7 receives as inputs column address signals BCAi–BCAk containing information about the block to be selected. More specifically, column fuse boxes CFB0–CFB7 are arranged between corresponding spare column decoders SCD0–SCD7, arranged in a column alongside of a column of four 2×2 matrices of sub memory cell arrays.

The illustrated spare memory cell array 100 further includes several control circuits C1–C7, sense amps SAs, and split word line driver blocks SWDs. Subsets of these elements are provided, each subset corresponding to a group of four peripheral spare sub memory cell arrays SMA-. Referring to FIG. 2, a number of pairs of circuits C1 and C1', C3 and C3', C5 and C5', ..., C17 and C17' are shown as being separately arranged from each other. However, each of these pairs of circuits is actually arranged in the form of a single control circuit (i.e., C1≡C1', C3≡C3', C5≡C5', ..., C17≡C17'). Each of control circuits C1–C17 may be identical in structure.

By way of example, control circuit C1 may comprise two NAND gates ND1 and ND2, receiving at their respective inputs word line driving signal $\phi$X0 and $\phi$X2, and two inverters I1 and I2 connected to the outputs of NAND gates ND1 and ND2. Control circuit C1 controls split word line drivers SWDs positioned on spare sub memory cell arrays SMA1/1 and SMA1/2. NAND gates ND1 and ND2 also receive a common input signal which comprises a block selecting signal BLS0 generated from a corresponding row fuse box RFB0.

Control circuit C2 also comprises two NAND gates connected to a pair of split word line drivers SWDs, one at each side thereof. The SWDs are respectively positioned between a first (left) pair of spare sub memory cell arrays SMA1/1 and SMA 2/1 and a second (right) pair of spare sub memory cell arrays SMA1/2 and SMA 2/2. The NAND gates of control circuit C2 receive respective input word line driving signals $\phi$X1 and $\phi$X3, and receive a common input signal which comprises block selecting signal BLS0. Block selecting signal BLS0 is also applied to the sense amps SAs which are adjacent the first and second pairs of spare sub memory cell arrays.

The NAND gates of control circuit C3 are connected to a pair of split word line drivers SWDs, respectively positioned between first and second pairs of spare sub memory cell arrays, including a first pair SMA2/1 and SMA3/1 and a second pair SMA2/2 and SMA3/2. The NAND gates of control circuit C3 receive respective input word line driving signals $\phi$X0 and $\phi$X2 and receive a common input signal which comprises a "combined" block selecting signal BLS01. Combined block selecting signal BLS01 is obtained by inverting, with inverter 23, an output of a NOR gate 21 which receives at its input two block selecting signals BLS0 and BLS1. Combined block selecting signal BLS01 is also applied to sense amps which are adjacent to the above-noted first and second pairs of spare sub memory cell arrays (SMA2/1 and SMA3/1, and SMA2/2 and SMA3/2).

The NAND gates of control circuit C4 are connected to respective split word line drivers SWDs positioned between first and second pairs of spare sub memory cell arrays, including a first pair which comprises spare sub memory cell arrays SMA3/1 and SMA4/1 and a second pair which comprises spare sub memory cell arrays SMA3/2 and SMA4/2. These NAND gates receive respective input word line driving signals $\phi$X1 and $\phi$X3 and a common input block selecting signal BLS1.

The NAND gates of control circuit C5 are connected to a pair of respective split word line drivers SWDs, respectively positioned between first and second pairs of spare sub memory cell arrays, including a first pair SMA4/1 and SMA5/1 and a second pair SMA4/2 and SMA5/2. The NAND gates of control circuit C5 receive respective input word line driving signals $\phi$X0 and $\phi$X2 and receive a common input signal which comprises a combined block selecting signal BLS12. Combined block signal BLS12 is obtained by ORing block selecting signals BLS1 and BLS2. Combined blocking signal BLS12 is also applied to sense amps which are adjacent to the above-noted first and second pairs of spare sub memory cell arrays (SMA4/1 and SMA5/1, and SMA4/2 and SMA5/2).

Control circuit C17 controls a split word line driver block connected word lines of spare sub memory cell arrays SMA16/1 and SMA16/2. The NAND gates of control circuit C17 receive respective input word line driving signals $\phi$X0 and $\phi$X2 and a common input eighth block selecting signal BLS7.

In the embodiment illustrated in FIG. 2, word line driving signals are arranged by being divided into the odd number signals and even number signals. However, all the word line driving signals ($\phi$X0–$\phi$X3) may be arranged in one area or may be arranged while being divided in both sides of the spare memory cell. In order to reduce the number of bus lines and to simplify a layout, it is preferred to provide a word line driving signal generating circuit (as shown in FIG. 2) on both sides of the row decoder, and to provide word line driving signals divided into odd number signals and the even number signals (as shown in FIG. 2). The control circuits can be arranged in the areas within the memory cell array where sense amps and split word line driver blocks are not arranged, and the arrangement thereof can be varied according to the layout condition and the environment on the memory cell array. In addition, since the equalizing circuit for the bit line is also provided in an area where the sense amps are arranged, it is possible to control the equalizing circuit as well as the sense amps and split word line drivers by using the same control circuits.

In FIG. 2, a respective column fuse box CFB0–CFB7 is provided for each unit spare mat M0–M7. Therefore, when a particular column block (i.e., one of memory blocks MB1 and MB2) included in the unit spare mat is selected according to block selecting column address signals BCAi, BCAj and BCAk, the appropriate column selecting lines of the corresponding unit spare mat are enabled, which controls the column selecting switch connecting bit line pairs and input/output line pairs. Data is selected from an appropriate column block of spare memory cell array 100 and outputted to the outside of the chip through a path formed of: the bit line pairs—the bit line sense amp (SA)—the column selecting switch—input/output pairs—input/output line sense amp—data bus.

The block selecting row address signals BRAi, BRAj and BRAk applied to the row fuse box (RFB-) are identical with the row address signals for the block selection in the normal memory cell array. In addition, the block selecting row address signals BCAi, BCAj and BCAk applied to the column fuse box CFB- are identical with the column address signals for the block selection in the normal memory cell array.

The manner of arrangement of spare memory cell array 100 (dividing groups of sub memory sell arrays into by the unit spare mats as shown in FIG. 2) may be identically applied to a normal memory cell array to be repaired. That is, groups of four 256Kb sub memory cell arrays may be designated to correspond to one unit mat, and control circuits with a structure and arrangement as shown in FIG. 2 may be provided. Accordingly, when an address signal corresponding to a memory block having a defect is inputted by applying the row address signal for the block selection to the fuse box used in the general redundancy device, the sense amp and the split word line driver are disabled by the aforementioned control circuits, thereby cutting off the path of the stand-by current. Furthermore, the path of the power supply applied to the split sub word line driver can be cut off.

Figure 3:
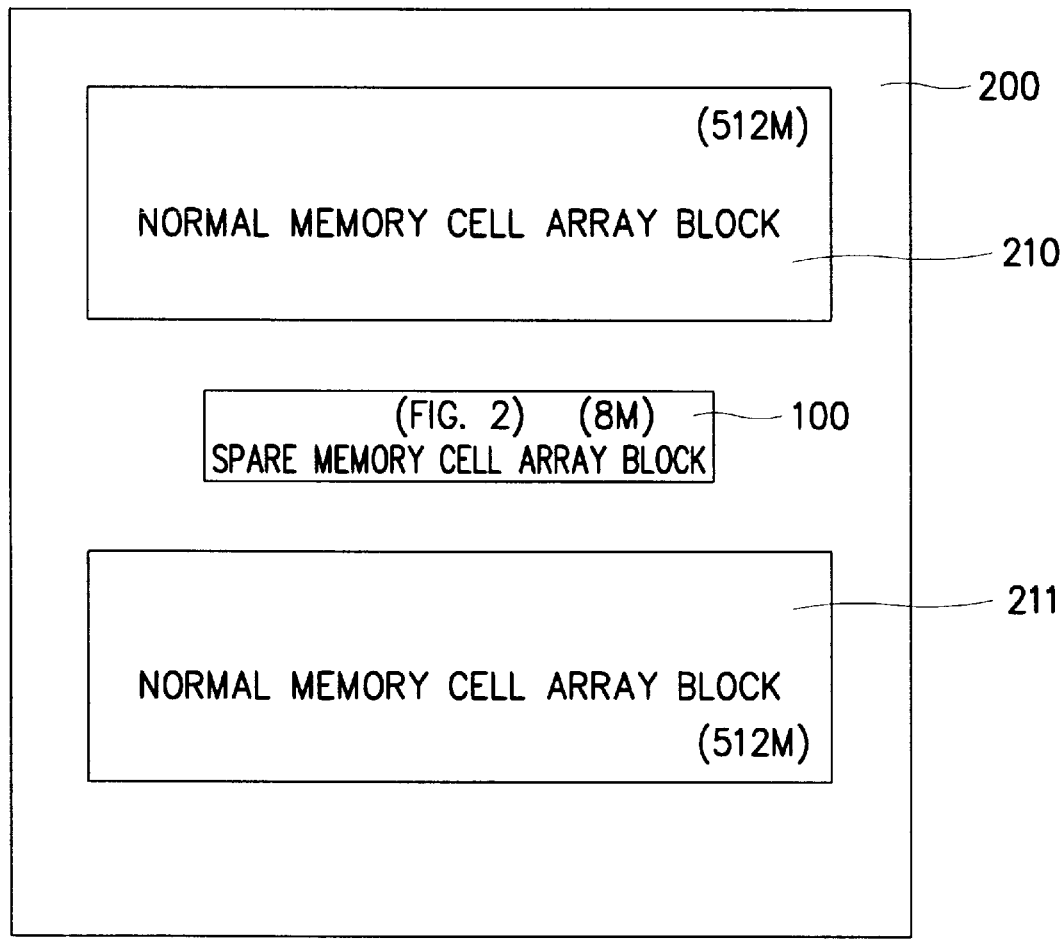
FIG. 3 is a block diagram of normal memory cell array blocks and corresponding spare memory cell array block.

FIG. 3 illustrates interconnections between normal memory cell array blocks, 210 and 211, and spare memory cell array block 100. In this preferred embodiment each of normal memory cell array blocks, 210 and 211, has 512 Mb, and spare memory cell array block has 8 Mb. Accordingly, the embodiment depicted in FIG. 3 shows memory circuit arrangement when the memory cell becomes high-density-integrated circuit, e.g. more than 1 Giga bytes. In this embodiment, the redundancy scheme is required wherein a spare memory cell separately having row column decoder is substituted block by block.

In the embodiment illustrated in FIG. 3, the spare memory cell array block 100 included in one chip area 200 is disposed apart from and in between the normal memory cell array blocks 210 and 211. Such a scheme allows the semiconductor memory to perform corresponding repair operation by mats having a memory capacity of 1 Mb in the embodiment of the present invention as illustrated in FIG. 3A, which significantly increases its repair efficiency.

Figure 3A:
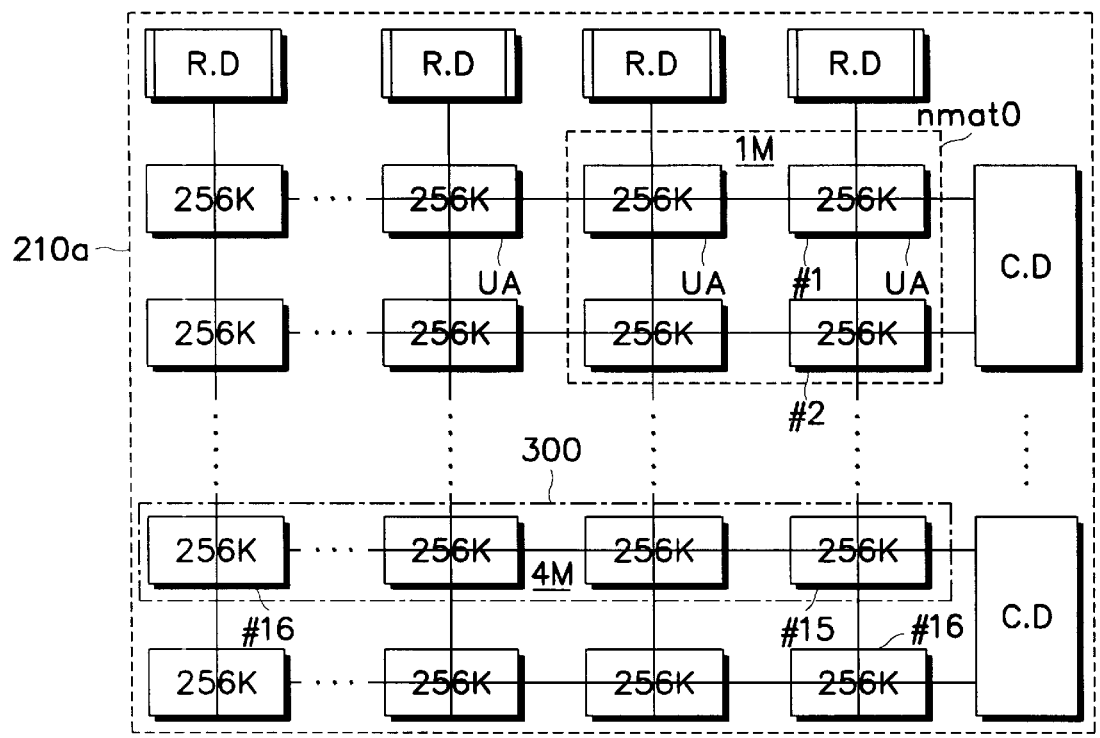
FIG. 3A is a schematic block diagram illustrating the entire spare memory cell array block.
Figure 3A:
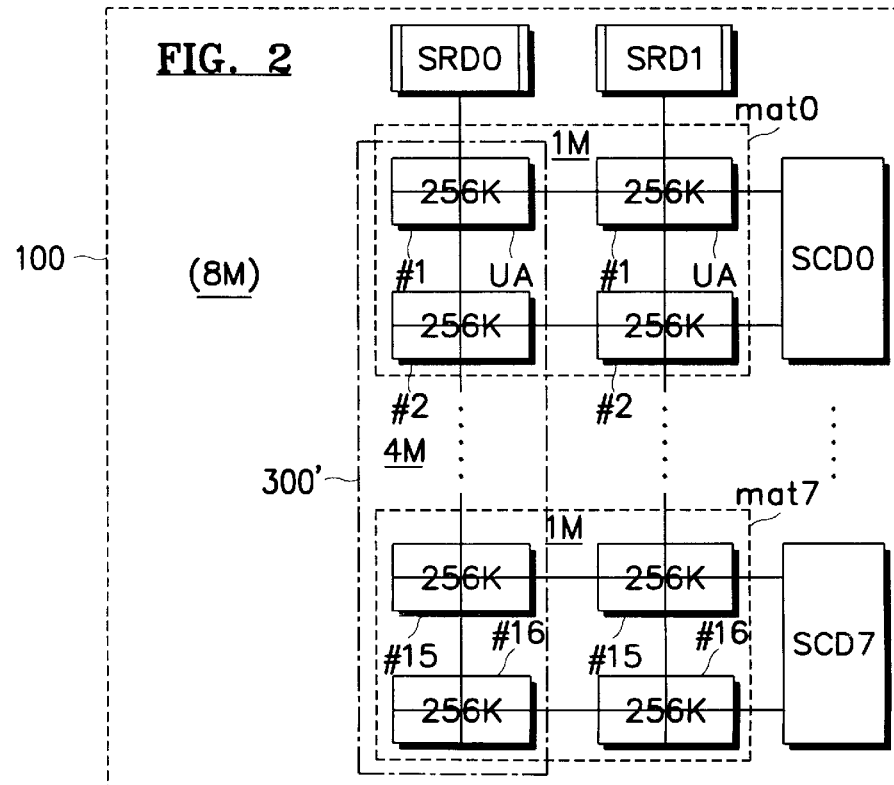

FIG. 3A is a schematic block diagram illustrating the entire spare memory cell array block 100 and a part of the normal memory cell array block 210 of FIG. 3. The normal memory cell array block 210 having a memory capacity of 512Mb as shown in FIG. 3 is comprised of eight memory blocks, each memory block having a memory capacity of 64Mb. One of the eight memory blocks 210a is shown in FIG. 3A. For example, if any defective memory cells are detected in a normal mat "nmat1", included in the block 210a, a spare mat "mat1", included in the block 100, is substituted for the defective cells in the block 210a. Here, a spare mat "mat1" has a memory capacity of 1Mb, which is comprised of four unit arrays (UA), each having a capacity of 256Kb. Therefore, the repair efficiency in the present invention is enhanced four times as compared with the repair efficiency in the prior art semiconductor memory device, which reduces the entire chip size of the semiconductor memory device.

Accordingly, the present invention has advantages in that if the number of the spare mat "mat1" is eight, the spare mats "mat0" to "mat7", respectively, have a spare column decoder SCD0 to SCD7, and commonly have two spare row decoders SRD0 and SRD1. Here, the spare low decoder SRD1 may have a memory capacity of 4Mb, which is commonly connected to a set of sixteen 256Kb unit arrays (UA) arranged along the same row.

Further, even when the block failure is generated in the direction of column of block 300', as shown in FIG. 3A, the repair operation can be carried out by substituting corresponding unit arrays (UA) of block 300', included in the spare memory cell array block 100 for the block failure. In this case, the normal block address of the normal column decoder is identified through fuse-cutting. In addition, the repair operation for the spare block address can be carried out through cutting the fuse corresponding to the address of the different block 300. The two spare row decoders SRD0 and SRD1 are enabled upon inputting any addresses of the unit array blocks #1 to #16; whereas, XG0, XG1 and XG2 generators are enabled upon inputting respective addresses of the unit array blocks #1 to #16. Therefore, the enabling operations of the word line and bit line sense amplifier can be performed in the respective unit array blocks.

Since the redundancy array block of the present invention has the spare row decoder and spare column decoder, independently operating from each other, the repair operation can be flexibly carried out when the block failure is generated in the direction of the row of the corresponding block or in the direction of the column thereof, so as to further reduce the chip size of the semiconductor memory to the minimum and significantly increase the repair efficiency. Although not shown in FIG.3A, it is a matter of course that the normal cell array block 211 of FIG. 3 can be similarly disposed as that of the normal cell array block 210 in relation to the spare memory cell array block 100 of FIG. 3A.

As previously discussed, the present invention has advantages in that it is capable of preserving manufacturing yield in spite of the defects encountered in manufacturing of the high density integrated semiconductor memory device having a large capacity, e.g., of 256Mb or more, and it improves the redundancy efficiency by providing spare units which are more subdivided than conventional spare block units.

While what is considered to be a preferred embodiment of the present invention has been described and illustrated, it will be understood by those skilled in the art that various changes and modifications may be made, and equivalents may be substituted for various disclosed elements without departing from the true scope of the present invention.

The present disclosure is related to Korean Patent Application No. 9603, filed on Apr. 24, 1995, the content of which is hereby expressly incorporated herein by reference in its entirety.

What is claimed is:

1. A semiconductor memory device having a plurality of normal memory cell array blocks having a plurality of memory cell arrays and a spare memory cell array block for redundancy, said spare memory cell array block comprising:

a plurality of unit spare mats having a plurality of sub memory cell array blocks, split word line driver blocks, sense amplifiers, spare column decoders, and spare row decoders, said spare column decoders and spare row decoders performing their decoding operations independent of decoding operations of said normal memory cell array blocks; and a control circuit for controlling said split word line driver blocks included in said unit spare mats in response to predetermined address signals;

said spare memory cell array block being disposed apart from and in between said normal memory cell array blocks, so that in case any defective cells are detected in any one of said normal memory cell array blocks, a repair operation by substituting corresponding cells of said sub memory cell array blocks for said defective cells is carried out block by block in said sub memory cell array blocks of said spare memory cell array block.

2. In a semiconductor memory device comprising a plurality of normal memory cell array blocks, having a plurality of memory cell arrays and split word line driver blocks, and at least one spare memory cell array block for redundancy, said spare memory cell array block comprising:

a plurality of unit spare mats having a plurality of sub memory cell array blocks, split word line driver blocks, a spare row decoder, and a spare column decoder, said spare row decoder and spare column decoder performing decoding operations independently of decoding operations performed by said normal memory cell array blocks; and control means for controlling said split word line driver blocks included in said unit spare mats in response to predetermined address signals;

said spare memory cell array block being disposed apart from and in between said normal memory cell array blocks.

3. The semiconductor memory device as claimed in claim 2, wherein said control means comprises block select means responsive to predetermined block select address signals.

4. The semiconductor memory device as claimed in claim 3, wherein said block select address signals comprise block select row address signals.

5. The semiconductor memory device as claimed in claim 3, wherein said block select means comprises a circuit having a fuse.

6. The semiconductor memory device as claimed in 2, further comprising a plurality of column fuse boxes for selecting said sub memory cell array blocks.

7. The semiconductor memory device as claimed in claim 2, wherein in case any defective cells are detected in any one of said normal memory cell array blocks, a repair operation by substituting corresponding cells of said sub memory cell array blocks for said defective cells is carried out unit spare mat by unit spare mat in said spare memory cell array block.

* * * * *